(12) United States Patent
Liang et al.

(10) Patent No.: US 11,522,090 B2
(45) Date of Patent: Dec. 6, 2022

(54) FLAT PANEL DETECTION SUBSTRATE, FABRICATING METHOD THEREOF AND FLAT PANEL DETECTOR

(71) Applicants: Beijing BOE Technology Development Co., Ltd., Beijing (CN); BOE Technology Group Co., Ltd., Beijing (CN)

(72) Inventors: Kui Liang, Beijing (CN); Xiaohui Liu, Beijing (CN); Hu Meng, Beijing (CN); Dali Liu, Beijing (CN); Liye Duan, Beijing (CN); Chiachiang Lin, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 54 days.

(21) Appl. No.: 16/976,148

(22) PCT Filed: Dec. 16, 2019

(86) PCT No.: PCT/CN2019/125646
§ 371 (c)(1),
(2) Date: Aug. 27, 2020

(87) PCT Pub. No.: WO2020/168797
PCT Pub. Date: Aug. 27, 2020

(65) Prior Publication Data
US 2021/0013347 A1    Jan. 14, 2021

(30) Foreign Application Priority Data

Feb. 21, 2019 (CN) .......................... 201910129999.2

(51) Int. Cl.
*H01L 27/14* (2006.01)
*H01L 31/0216* (2014.01)
(Continued)

(52) U.S. Cl.
CPC .. *H01L 31/02165* (2013.01); *H01L 27/14601* (2013.01); *H01L 31/0224* (2013.01); *H01L 31/022408* (2013.01); *H01L 31/1085* (2013.01)

(58) Field of Classification Search
CPC .......... H01L 31/02165; H01L 31/0224; H01L 31/022408; H01L 31/1085; H01L 31/09; (Continued)

(56) References Cited

U.S. PATENT DOCUMENTS 5,631,490 A    5/1997 Dutta et al.
6,784,949 B1 *  8/2004 Nagata .............. H01L 27/14609
                                                349/39

(Continued)

FOREIGN PATENT DOCUMENTS

CN    105097860 A    11/2015
CN    106535768 A     3/2017
(Continued)

*Primary Examiner* — Calvin Y Choi
(74) *Attorney, Agent, or Firm* — Nath, Goldberg & Meyer; Joshua B. Goldberg

(57) ABSTRACT

The present disclosure provides a flat panel detection substrate, a fabricating method thereof and a flat panel detector. The flat panel detection substrate according to the present disclosure includes a base substrate; a bias electrode and a sense electrode on the base substrate; and a semiconductor layer over the bias electrode and the sense electrode, the semiconductor layer having a thickness greater than 100 nm.

17 Claims, 5 Drawing Sheets

(51) Int. Cl.
*H01L 31/0224* (2006.01)
*H01L 27/146* (2006.01)
*H01L 31/108* (2006.01)

(58) Field of Classification Search
CPC ............ H01L 31/115; H01L 27/14601; H01L 27/14683; H01L 27/14632; H01L 27/14663; H01L 27/14603; H01L 27/14676; H01L 27/14687; H01L 27/1463; H01L 27/307; H01L 27/14636; H01L 27/14609; H01L 51/00; G01T 1/24; G01T 1/241; G01N 23/04; A61B 6/4233
See application file for complete search history.

(56) References Cited

U.S. PATENT DOCUMENTS

| | | | |
|---|---|---|---|
| 9,698,193 B1* | 7/2017 | Karim | G01T 1/241 |
| 2004/0119688 A1* | 6/2004 | Troxell | G06F 3/04886 |
| | | | 345/156 |
| 2010/0072470 A1* | 3/2010 | Yamazaki | H01L 27/0251 |
| | | | 257/43 |
| 2017/0018588 A1* | 1/2017 | Karim | A61B 6/4233 |
| 2018/0090620 A1* | 3/2018 | Morosawa | H01L 21/02186 |

FOREIGN PATENT DOCUMENTS

| | | |
|---|---|---|
| CN | 108878544 A | 11/2018 |
| CN | 109713076 A | 5/2019 |
| CN | 209571423 U | 11/2019 |

* cited by examiner

US 11,522,090 B2

FLAT PANEL DETECTION SUBSTRATE, FABRICATING METHOD THEREOF AND FLAT PANEL DETECTOR

CROSS REFERENCE TO RELATED APPLICATION

This is a National Phase Application filed under 35 U.S.C. 371 as a national stage of PCT/CN2019/125646, filed on Dec. 16, 2019, an application claiming priority to Chinese patent application No. 201910129999.2, filed on Feb. 21, 2019, the entire contents of which are incorporated herein by reference.

TECHNICAL FIELD

The present disclosure belongs to the field of detector technologies, and in particular, to a flat panel detection substrate, a fabricating method thereof and a flat panel detector.

BACKGROUND

Different from a traditional P-I-N photodiode detector, the photoelectric detector with the metal-semiconductor-metal interdigital electrode structure does not need to be P-type doped, has the advantages of simple fabrication process, low cost, compatibility with fabrication processes of a thin film transistor, a field effect transistor and the like, easy integration, high response speed, small dark current, high filling rate and the like, and holds a significant position in the fields of medical imaging and industrial detection.

SUMMARY

In one aspect, the present disclosure provides a flat panel detection substrate, including:
a base substrate;
a bias electrode and a sense electrode on the base substrate; and
a semiconductor layer covering over the bias electrode and the sense electrode, the semiconductor layer having a thickness greater than 100 nm.

In an embodiment, the semiconductor layer is in direct contact with the bias electrode and the sense electrode.

In an embodiment, a material of the semiconductor layer includes a-Si.

In an embodiment, the semiconductor layer includes a first semiconductor layer and a second semiconductor layer, the second semiconductor layer is on a side of the first semiconductor layer away from the bias electrode and the sense electrode; and a mobility of the second semiconductor layer is higher than a mobility of the first semiconductor layer.

In an embodiment, the mobility of the first semiconductor layer is less than 0.5 cm/vs, and the mobility of the second semiconductor layer is greater than 0.75 cm/vs.

In an embodiment, an insulating element is disposed between the bias electrode and the sense electrode, the semiconductor layer covers the bias electrode, the sense electrode, and the insulating element; and a material of the insulating element includes an inorganic insulating material.

In an embodiment, a thickness of the insulating element is between 100 nm and 300 nm.

In an embodiment, a dielectric layer is further disposed between the bias electrode and the semiconductor layer and between the sense electrode and the semiconductor layer, and a material of the dielectric layer includes a metal oxide.

In an embodiment, a material of the bias electrode and the sense electrode includes a metal; and the material of the dielectric layer includes an oxide of the metal.

In an embodiment, the bias electrode and the sense electrode are in an interdigital comb structure.

In an embodiment, the flat panel detection substrate further includes: a thin film transistor; wherein a drain electrode of the thin film transistor is electrically coupled to the sense electrode.

In an embodiment, the flat panel detection substrate further includes an interlayer insulating layer on the substrate; and a first through hole and a second through hole penetrating the interlayer insulating layer, and the first through hole and the second through hole are not aligned in a vertical direction.

In an embodiment, the flat panel detection substrate further includes a connection electrode at least partially covering inner walls of the first and second through holes.

In an embodiment, the flat panel detection substrate further includes: a thin film transistor, wherein a drain electrode of the thin film transistor is coupled to the sense electrode through the connection electrode.

In another aspect, the present disclosure provides a method for fabricating a flat panel detection substrate, including: preparing a base substrate; and
forming a bias electrode and a sense electrode over the base substrate and a semiconductor layer covering the bias electrode and the sense electrode; wherein a thickness of the semiconductor layer is greater than 100 nm.

In an embodiment, the semiconductor layer is formed directly on the bias electrode and the sense electrode.

In an embodiment, the semiconductor layer includes a first semiconductor layer and a second semiconductor layer; a mobility of the second semiconductor layer is higher than a mobility of the first semiconductor layer, and forming the semiconductor layer includes:
depositing the first semiconductor layer at a first deposition rate; depositing the second semiconductor layer at a second deposition rate; the first deposition rate being greater than the second deposition rate.

In an embodiment, prior to forming the semiconductor layer, the method further includes:
forming an insulating element between the bias electrode and the sense electrode; wherein a material of the insulating element includes: an inorganic insulating material.

In an embodiment, a material of the bias electrode and the sense electrode includes a metal; a dielectric layer is between the bias electrode and the semiconductor layer and between the sense electrode and the semiconductor layer; a material of the dielectric layer includes a metal oxide; and forming the bias and sense electrodes and the dielectric layer includes:
forming a metal material layer; and
performing oxidation treatment on a surface of the metal material layer, and forming a pattern including the bias electrode, the sense electrode and the dielectric layer through a patterning process.

In another aspect, a flat panel detector is provided, which includes the flat panel detection substrate according to the embodiments of the present disclosure.

DETAILED DESCRIPTION

Figure 1:
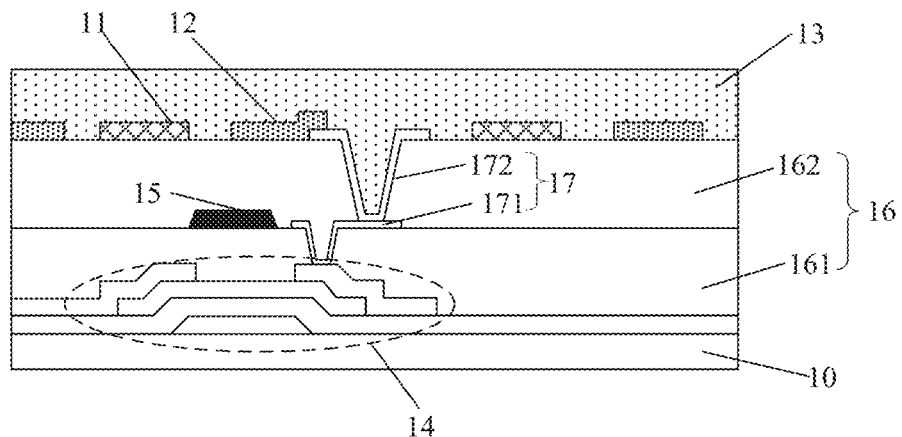
FIG. 1 is a schematic structural diagram of a flat panel detection substrate according to an embodiment of the disclosure.

In order to make those skilled in the art better understand the technical solutions of the present disclosure, the following detailed description is given with reference to the accompanying drawings and specific embodiments.

Compared with a structure in which the metal and the semiconductor are in direct contact with each other, the detector with the novel structure of the conventional metal-semiconductor-metal interdigital electrode structure (namely, a polyimide (PI) insulating layer is filled between the interdigital electrode and the semiconductor layer) can have obviously reduced dark current and improved detection efficiency. Under the illumination condition, the semiconductor layer of the detector receives light, charges are generated inside the semiconductor layer, and the resistance is greatly reduced, so that an optical signal is converted into an electrical signal through the photovoltaic effect. In this case, most of an external bias voltage is applied to the PI insulating layer having a high resistance. When the voltage is high enough, the PI insulating layer can be turned on based on the F-N tunneling effect of electrons, and an electrical signal generated in the semiconductor material can be transmitted to the drain electrode of the thin film transistor. Reading and storing are realized through turning on and off the thin film transistor, and the purpose of detection is further achieved.

However, the photoelectric detector with such a structure generally uses deposited metal (such as Mo/Al) as an interdigital electrode. Since the thickness of the PI insulating layer is limited (200 nm-300 nm) and the interdigital electrode needs to be completely covered by the PI insulating layer, the interdigital electrode generally needs to be made very thin (50 nm), which causes the interdigital electrode to be easily oxidized during the fabricating process, and the oxide layer on the interdigital electrode increases the tunneling difficulty of carriers in the PI insulating layer, increases the resistance, and affects the yield. The sense electrode is electrically coupled to the drain electrode of the thin film transistor by depositing metal into the through hole, so that signal transmission is realized. However, since the climbing performance of metal is not good, and the deposition coverage is poor, the fracture phenomenon easily occurs, which causes interruption of the signal transmission. Generally, the metal is in a columnar structure, the metal has steep corners or edges with large slope angles after being etched, the deposition coverage of subsequent films may be influenced after the metal is made thin, and poor contact is easy to occur at the corners or edges. It is difficult to realize uniform film thickness of the PI insulating layer itself in the fabricating process, and the difference between the maximum film thickness and the minimum film thickness reaches 70 nm-80 nm, which is particularly apparent near metal. The PI insulating layer is used as a dielectric layer, it is required that the uniformity of the film thickness thereof be controlled within 20 nm, otherwise, a large area of unevenness appears in a detector product. To solve the foregoing technical problem, the present disclosure provides the following embodiments.

As shown in FIG. 1, the present embodiment provides a flat panel detection substrate, which includes: a base substrate 10, a plurality of detection units on the base substrate 10, and a semiconductor layer 13 disposed on the plurality of detection units. Each detection unit includes: a bias electrode 11 and a sense electrode 12, a semiconductor layer 13 covers the bias electrode 11 and the sense electrode 12, and the thickness of the semiconductor layer 13 is greater than 100 nm. FIG. 1 shows only one detection unit.

Due to the material of the semiconductor layer 13, its effective thickness to light is less than 100 nm, that is, in the case of light illumination, a thickness of the semiconductor layer 13 in which the photo carriers are effective is less than 100 nm. If the thickness of the semiconductor layer 13 is greater than 100 nm, a portion having a distance more than 100 nm from the light incident surface of the semiconductor layer 13 functions as a dielectric layer. The portion of the semiconductor layer 13 functioning as the dielectric layer is insulating in a dark state at low voltage, and the resistance of the semiconductor layer 13 increases as the thickness of the semiconductor layer 13 increases. In the present embodiment, the semiconductor layer 13 with a thickness greater than 100 nm is disposed on the bias electrode 11 and the sense electrode 12 of the detection unit, and in this case, the portion of the semiconductor layer 13 having a distance smaller than 100 nm from the light incident surface thereof is configured to generate a corresponding electrical signal according to the received optical signal, and the remaining portion serves as a dielectric layer to perform the functions of insulation and reducing dark current.

In the present embodiment, the semiconductor layer 13 is designed to directly contact the bias electrode 11 and the sense electrode 12, and in this way, the semiconductor layer 13 has double-layer functions, i.e., a function of a photoelectric conversion layer and a function of a dielectric layer, so that the polyimide (PI) insulating layer between the detection unit and the semiconductor layer 13 can be omitted, the problem of the interface between the PI insulating layer and the semiconductor layer 13 can be avoided, and one step of process can be omitted. Further, in order to make the semiconductor layer 13 function as a dielectric layer and reduce dark current, the thickness of the semiconductor layer 13 is not less than 450 nm.

Figure 9:
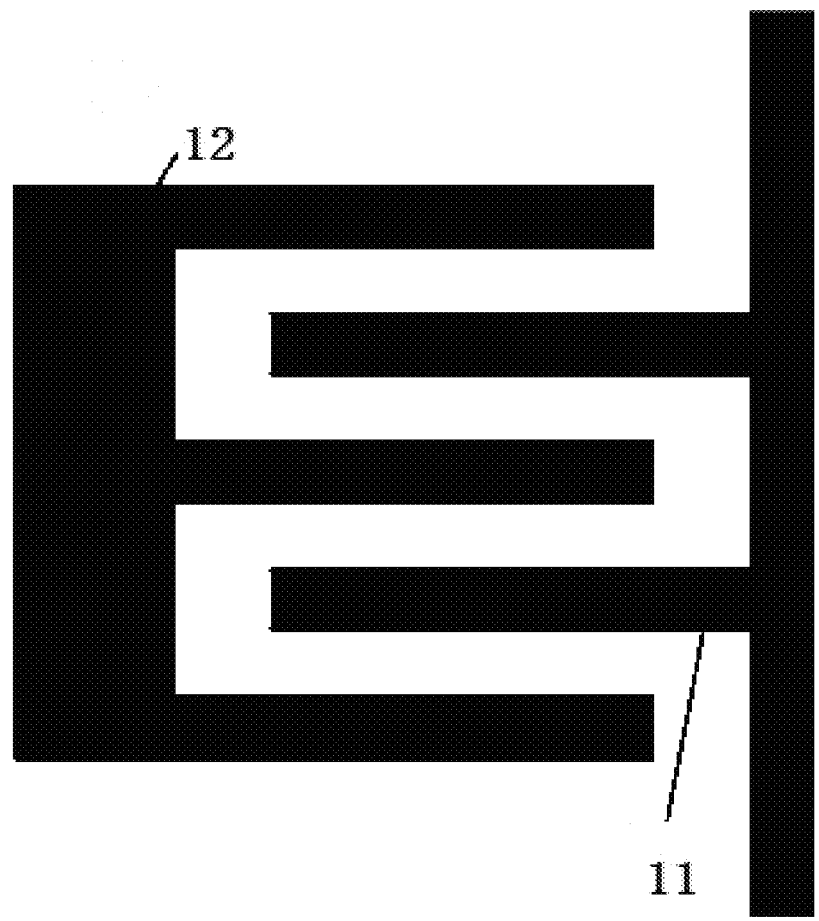
FIG. 9 is a schematic diagram of a layout of a bias electrode and a sense electrode according to an embodiment of the disclosure.

In the flat panel detection substrate of the present embodiment, the bias electrode 11 and the sense electrode 12 both may be made of a metal material, and the bias electrode 11 and the sense electrode 12 may form as an interdigital structure, for example, as shown in FIG. 9.

Figure 2:
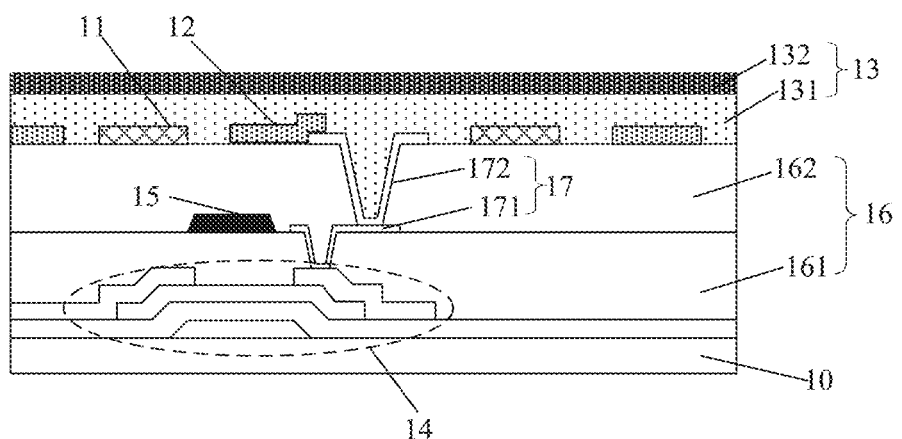
FIG. 2 is a schematic structural diagram of another flat panel detection substrate according to an embodiment of the disclosure.

In the flat panel detection substrate of the present embodiment, the material of the semiconductor layer 13 includes polycrystalline silicon (a-Si). Of course, the material of the semiconductor layer 13 is not limited to this material, and may be a semiconductor material having the same or similar property as a-Si. In an embodiment, the thickness of the semiconductor layer 13 is approximately from 100 nm to 600 nm, and the thickness of the semiconductor layer 13 may be adjusted according to a specific application. As shown in FIG. 2, in the flat panel detection substrate of the present embodiment, the semiconductor layer 13 includes a first semiconductor layer 131 and a second semiconductor layer 132 sequentially disposed above the base substrate 10, and the mobility of the second semiconductor layer 132 is higher than that of the first semiconductor layer 131, that is, the mobility of the first semiconductor layer 131 is a low mobility relative to the mobility of the second semiconductor layer 132, and the mobility of the second semiconductor layer 132 is a high mobility relative to the mobility of the first semiconductor layer 131, so that the second semiconductor layer 132 having the high mobility serves as a photoelectric conversion layer and the first semiconductor layer 131 having the low mobility serves as a dielectric layer. In the present disclosure, the mobility refers to carrier mobility.

Figure 8:
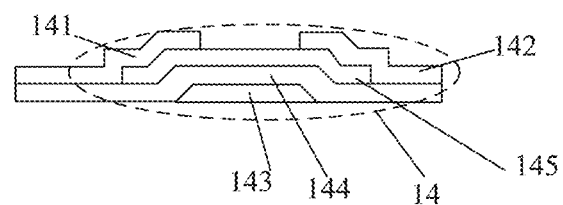
FIG. 8 is a schematic structural diagram of a thin film transistor in a flat panel detection substrate according to an embodiment of the present disclosure.

In the flat panel detection substrate of the present embodiment, each of the detection units further includes a thin film transistor 14. Referring to FIGS. 1 and 8, the thin film transistor 14 includes a gate electrode 143, a source electrode 141, a drain electrode 142, an active layer 145, and a gate insulating layer 144. The gate electrode 143 of the thin film transistor 14 is coupled to a detection control line, the source electrode 141 is coupled to a read line, and the drain electrode 142 is coupled to the sense electrode 12. Under the illumination condition, the semiconductor layer 13 receives light and generates charges therein, and the resistance of the semiconductor layer 13 is greatly reduced, so that the optical signal is converted into an electrical signal through the photovoltaic effect. At this time, most of the external bias voltage is applied to portion of the semiconductor layer 13 serving as the dielectric layer with high resistance. When the voltage is high enough, the portion of the semiconductor layer 13 serving as the dielectric layer can be electrically conducting due to the F-N tunneling effect of electrons. The signal written into the detection control line may control the on and off states of the thin film transistor 14, so as to realize the reading and the storage of the electrical signal generated in the semiconductor material, thereby achieving the purpose of detection.

In order to more clearly illustrate that the flat panel detection substrate using only the semiconductor layer with the thickness greater than 100 nm has better performance than the flat panel detection substrate using both the PI insulating layer and the semiconductor layer in the prior art, the following tests are performed by the flat panel detector using the flat panel detection substrate in the present embodiment and the flat panel detector using the flat panel detection substrate in the prior art, respectively, and the semiconductor material in the flat panel detection substrates is a-Si.

Figure 3:
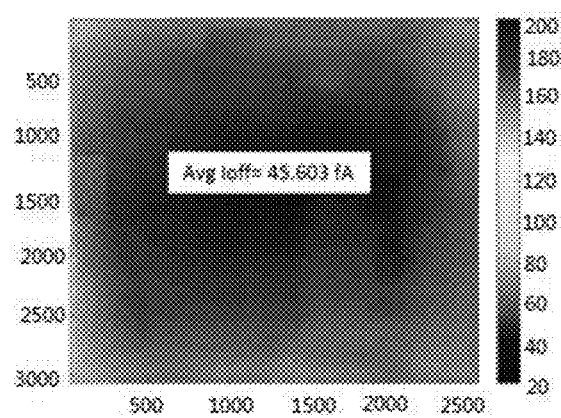
FIG. 3 is a schematic diagram of dark current generated by a flat panel detector with a flat panel detection substrate according to an embodiment of the present disclosure.
Figure 4:
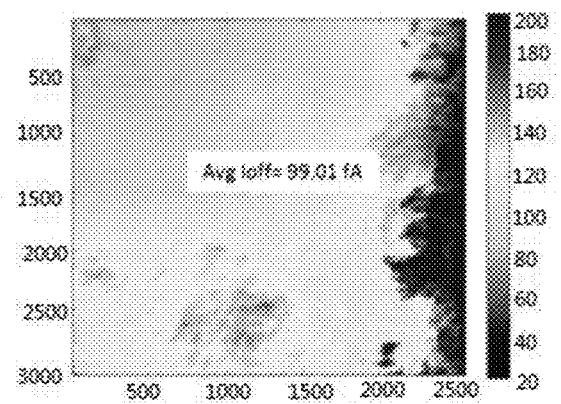
FIG. 4 is a schematic diagram of dark current generated by a conventional flat panel detector.

In an embodiment, as shown in FIGS. 3 and 4, the horizontal axis and the vertical axis in the drawings represent the column position and the row position of the detection unit on the flat panel detection substrate, respectively.

FIG. 3 shows the dark current generated by the respective detection units in the flat panel detection substrate, when a voltage of about 5 to 10V is applied to the bias electrode for a window time (illumination time, for example, illumination time of X-ray) of 0.4 s to 4.4 s, in the case where the flat panel detector using the flat panel detection substrate of the present embodiment is adopted. It may be seen that the dark current generated by the respective detection units in the flat panel detection substrate is uniform, and the average dark current Avg Ioff is 45.603 fA. FIG. 4 shows the dark current generated by the respective detection units in the flat panel detection substrate, when a voltage of about 200V is applied to the bias electrode for a window time of 0.4-4.4 s, in the case where the flat panel detector using the flat panel detection substrate in the prior art is adopted. It may be seen that the dark current generated by the respective detection units in the flat panel detection substrate is very non-uniform, and the average dark current Avg Ioff is 99.01 fA.

In summary, compared with the prior art, the dark current of the flat panel detector using the flat panel detection substrate of the present embodiment is significantly uniform and smaller, so the performance of the flat panel detector using the flat panel detection substrate of the present embodiment is better.

Figure 5:
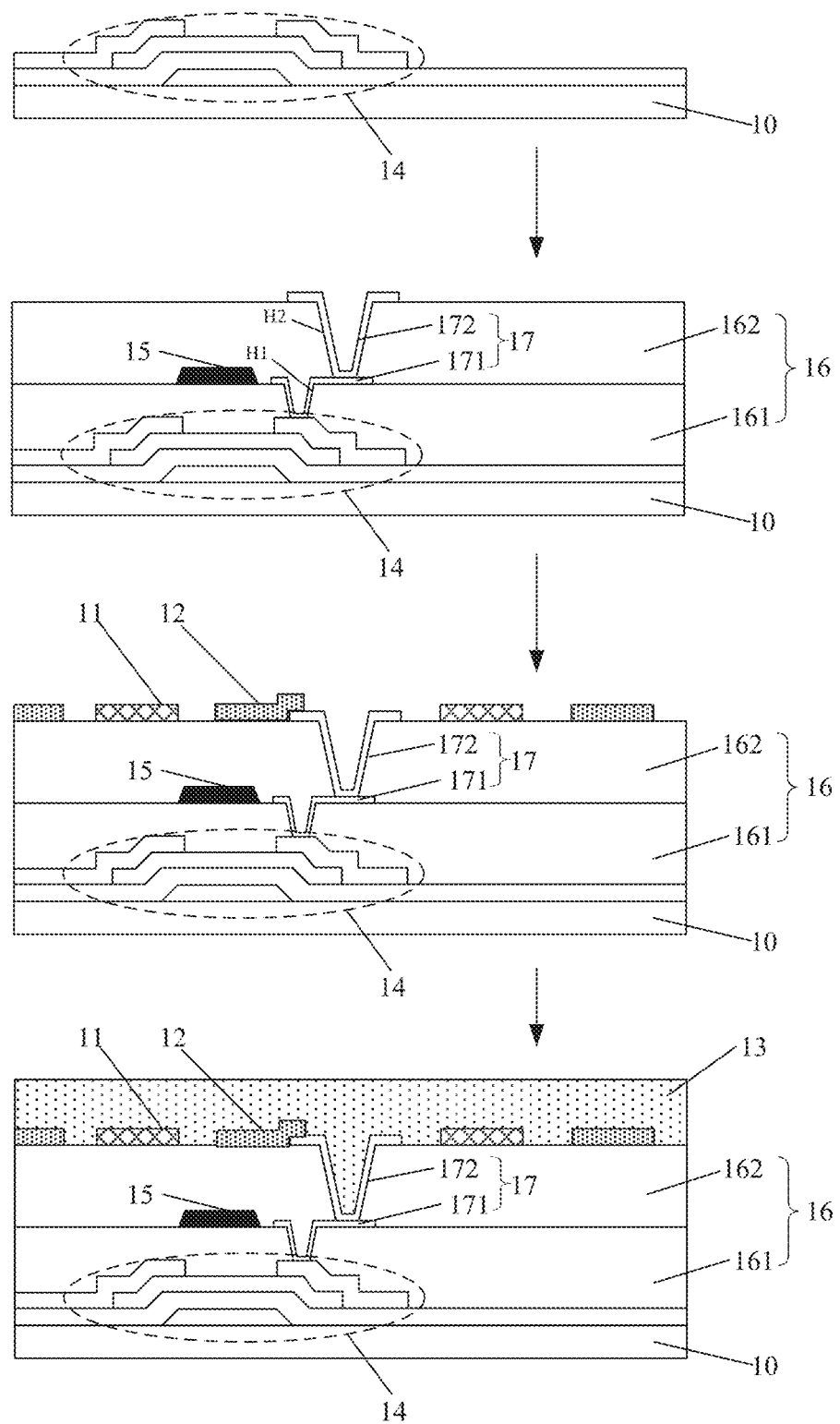
FIG. 5 is a flowchart of a method for fabricating a flat panel detection substrate according to an embodiment of the disclosure.

Moreover, under the above test conditions, in a case where the linearity of the dark current of the flat panel detector adopting the flat panel detection substrate of the present embodiment is measured, it is found that compared with the prior art, the linearity of the dark current in the present embodiment is 0.999796, while the linearity of the dark current in the prior art is 0.999659. Obviously, the linearity of the dark current in the present embodiment is superior, so the image detection of the flat panel detector using the flat panel detection substrate of the present embodiment is more accurate. Correspondingly, in this embodiment, a method for fabricating the flat panel detection substrate described above is further provided, and as shown in FIG. 5, the method may specifically include the following steps.

In Step one, layer structures of the thin film transistor 14 in each detection unit are formed on the base substrate 10 by a patterning process.

In Step two, an interlayer insulating layer 16 is formed on the base substrate 10 subjected to Step one, a through hole is etched at a position of the interlayer insulating layer 16 corresponding to the drain electrode of the thin film transistor 14, and then a connection electrode 17 covering the through hole is formed by a patterning process.

The thin film transistor 14 formed in Step one may be a top gate type thin film transistor 14, or a bottom gate type thin film transistor 14. When the thin film transistor 14 is a bottom gate type thin film transistor 14, in order to prevent light from irradiating on the active layer of the thin film transistor 14 to destroy the switching characteristics of the thin film transistor 14, a light shielding pattern 15 corresponding to the active layer of the thin film transistor 14 is further formed on the layer in which the thin film transistor 14 is located. When the light shielding pattern 15 is made of a metal material, a first buffer layer and a first interlayer insulating layer 161 are required to be sequentially formed on the layer in which the thin film transistor 14 is located, and then the light shielding pattern 15 is formed by a patterning process. A second interlayer insulating layer 162 is formed after the light shielding pattern 15 is formed. That is, the interlayer insulating layer 16 formed in Step two includes the aforementioned first interlayer insulating layer 161 and second interlayer insulating layer 162. In an embodiment, the first interlayer insulating layer 161 is conformally formed with the first buffer layer. Alternatively, the first buffer layer may not be formed. In order to prevent the light shielding pattern 15 made of the metal material from generating dark current, the first interlayer insulating layer 161 and the second interlayer insulating layer 162 are thick. In order to prevent breakage of the connection electrode 17 covering the through hole penetrating through the second interlayer insulating layer 162 and the first interlayer insulating layer 161 due to the fact that the through hole is too deep, a first through hole H1 may be formed by etching after the first interlayer insulating layer 161 is formed, and the first connection electrode 171 coupled to the drain electrode of the thin film transistor 14 may be formed after the first through hole H1 is formed. The second interlayer insulating layer 162 is formed after the first connection electrode 171 is formed, the second interlayer insulating layer 162 is etched to form a second through hole H2, and the first connection electrode 171 is exposed at the position of the second through hole H2, followed by forming the second connection electrode 172 covering the second through hole H2. In an embodiment, the first through hole H1 and the second through hole H2 are offset with respect to each other. That is, the first through hole H1 and the second through hole H2 are not aligned with each other in a vertical direction. In an embodiment, the vertical direction represents a direction perpendicular to an upper surface of the base substrate 10. The second connection electrode 172 is electrically coupled to the first connection electrode 171. That is, the first through hole H1 and the second through hole H2 constitute the through hole formed in Step two, and the first and second connection electrodes 171 and 172 constitute the connection electrode 17 formed in Step two.

In Step three, a pattern including a bias electrode 11 and a sense electrode 12 in the detection unit is formed by a patterning process on the base substrate 10 subjected to Step two. The sense electrode 12 in each detection unit is coupled to the drain electrode of the thin film transistor 14 through the connection electrode 17 in the detection unit.

The bias electrode 11 and the sense electrode 12 are generally made of a metal material, and thus a second buffer layer may be formed on the interlayer insulating layer 16 before the pattern of the bias electrode 11 and the sense electrode 12 is formed.

In Step four, a semiconductor layer 13 is formed on the base substrate 10 subjected to Step three. The thickness of the semiconductor layer 13 is greater than 100 nm.

In an embodiment, the semiconductor layer 13 may include a first semiconductor layer 131 and a second semiconductor layer 132 sequentially disposed over the base substrate 10, and the mobility of the second semiconductor layer 132 is higher than that of the first semiconductor layer 131. That is, the mobility of the first semiconductor layer 131 is a low mobility, and the mobility of the second semiconductor layer 132 is a high mobility. The high mobility is more than 0.75 cm/vs, and the low mobility is less than 0.5 cm/vs.

For convenience of fabricating, a-Si may be used as a material of each of the first and second semiconductor layers 131 and 132. A method of forming the second semiconductor layer 132 with the high mobility and the first semiconductor layer 131 with the low mobility will be described below.

Firstly, a low-mobility a-Si material layer is deposited at a first deposition rate to form the first semiconductor layer 131, and then, a high-mobility a-Si material layer is deposited at a second deposition rate to form the second semiconductor layer 132. The first deposition rate is greater than the second deposition rate. At this time, the second semiconductor layer 132 with the high mobility is equivalent to a photoelectric conversion layer; the first semiconductor layer 131 with the low mobility is equivalent to a dielectric layer, so that the preparation of the PI insulating layer can be omitted in the fabricating method of the present embodiment, thereby simplifying the fabricating process.

Figure 6:
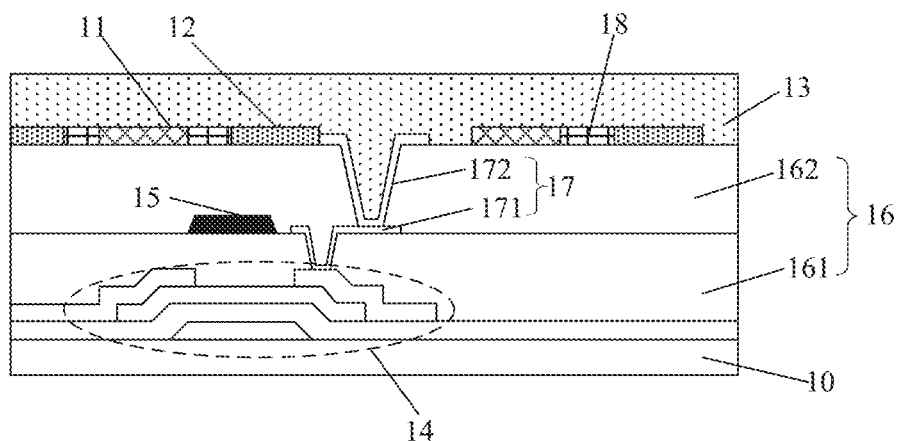
FIG. 6 is a schematic structural diagram of another flat panel detection substrate according to an embodiment of the disclosure.

As shown in FIG. 6, the present embodiment provides a flat panel detection substrate, which has a structure substantially the same as that of the flat panel detection substrate in the above embodiments, except that an insulating element 18 is disposed between the bias electrode 11 and the sense electrode 12 (it should be noted that the insulating element 18 usually covers the edges of the bias electrode 11 and the sense electrode 12 adjacent to the insulating element 18 for process reasons), and the material of the insulating element 18 includes an inorganic insulating material. The semiconductor layer 13 of the flat panel detector is above the bias electrode 11, the sense electrode 12 and the insulating element 18.

Since the flat panel detection substrate of the present embodiment includes the insulating element 18 disposed between the bias electrode 11 and the sense electrode 12, and the material of the insulating element 18 includes an inorganic material, the inorganic material of the insulating element 18 is more likely to be flat at the edge positions of the bias electrode 11 and the sense electrode 12 than the PI insulating layer, thereby avoiding the uniformity problem occurring in the PI insulating layer. In addition, in the embodiment, a PI insulating layer is not required to be arranged, so that the fabricating difficulty of the flat panel detection substrate can be greatly reduced, and the productivity can be improved. In particular, the voltage of 200V or more is required to drive the flat panel detector to work in the prior art, while in the embodiment of the present disclosure, the PI insulating layer is omitted and the working voltage of only 10-20V is required, thereby greatly reducing power consumption.

In the present embodiment, the insulating element 18 may be a silicon oxide film, a silicon nitride film, or a composite film of silicon oxide and silicon nitride. The thickness of the insulating element 18 is approximately from 100 nm to 300 nm, and the specific thickness may be set according to the specific substrate structure.

The remaining structures of the flat panel detection substrate in this embodiment may be the same as those in the above embodiments, and therefore, the description thereof will not be repeated.

Accordingly, in this embodiment, there is also provided a method of fabricating the flat panel detection substrate described above, which is substantially the same as the method in above embodiments, except that a step of forming the insulating element 18 by a patterning process is added between Step three and Step four, and the material of the insulating element 18 includes an inorganic insulating material.

The fabrication of the remaining structures of the flat panel detection substrate is the same as the fabrication process in the above embodiments, and therefore, the description thereof is omitted.

Figure 7:
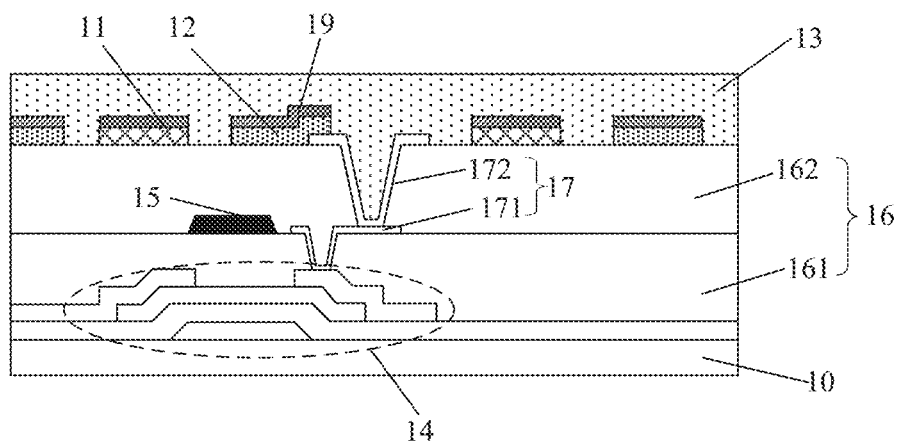
FIG. 7 is a schematic structural diagram of another flat panel detection substrate according to an embodiment of the disclosure.

As shown in FIG. 7, the present embodiment provides a flat panel detection substrate, which has a structure substantially the same as that of the flat panel detection substrate in the above embodiments, except that a dielectric layer 19 is provided between the bias electrode 11 and the semiconductor layer 13 and between the sense electrode 12 and the semiconductor layer 13, and the material of the dielectric layer 19 is a metal oxide. Since the dielectric layer 19 of metal oxide is disposed between the bias electrode 11 and the semiconductor layer 13 and between the sense electrode 12 and the semiconductor layer 13, dark current generated in the semiconductor layer 13 of the flat panel detection substrate can be reduced, and the metal oxide can be broken down during operation, thereby achieving current transmission.

When the bias electrode 11 and the sense electrode 12 are made of a metal material in the embodiment, the metal oxide material of the dielectric layer 19 can be obtained by oxidizing the metal material used for the bias electrode 11 and the sense electrode 12, so as to save the process steps and reduce the cost.

The metal material may include any one of copper (Cu), molybdenum (Mo), and aluminum (Al). Of course, the metal material is not limited thereto, and the specific metal material may be selected according to the process conditions.

The remaining structures of the flat panel detection substrate in the embodiment may be the same as those in the above embodiments, and therefore, the description thereof will not be repeated.

Accordingly, in the embodiment, a method for fabricating the flat panel detection substrate described above is also provided, which is substantially the same as the method in the above embodiments except that a step of forming the dielectric layer 19 is added between Step three and Step four, and the dielectric layer is made of metal oxide.

When the bias electrode 11 and the sense electrode 12 are made of a metal material in this embodiment, the metal oxide material of the dielectric layer can be obtained by oxidizing the metal material used for the bias electrode 11 and the sense electrode 12.

The steps of forming the bias electrode 11, the sense electrode 12 and the dielectric layer 19 specifically include the following.

A metal material layer is formed on the interlayer insulating layer 16, and a metal oxide layer is formed by a thermal oxidation process (it should be noted here that only a part of the metal material layer away from the base substrate 10 is oxidized, and the rest of the metal material layer is not oxidized). Finally, the patterns including the bias electrode 11, the sense electrode 12 and the dielectric layer 19 are formed through a patterning process. The dielectric layer covers the bias electrode 11 and the sense electrode 12. The metal oxide layer formed by adopting a thermal oxidation process has high compactness and better insulation effect compared with an insulation layer deposited on metal, such as silicon oxide, silicon nitride and the like.

The metal material may include any one of copper (Cu), molybdenum (Mo), and aluminum (Al). Of course, the metal material is not limited thereto, and the specific metal material may be selected according to the process conditions. The thickness of the metal material layer is about 3000 Å, and the thickness of the formed dielectric layer is about 5 nm-20 nm.

The fabrication of the remaining structures of the flat panel detection substrate is the same as the fabrication process in the above embodiments, and therefore, the description thereof is omitted.

The present embodiment provides a flat panel detector, which includes any one of the flat panel detection substrates according to the embodiments of the present disclosure, and the flat panel detector may further include a planarization layer and the like disposed on the semiconductor layer 13.

The flat panel detector in this embodiment may be an X-ray flat panel detector.

Since the flat panel detector in this embodiment includes any one of the flat panel detection substrates in the embodiments of the present disclosure, and in the flat panel detection substrate, the semiconductor layer 13 with a thickness greater than 100 nm is disposed on the bias electrode 11 and the sense electrode 12 of the detection unit, a portion of the semiconductor layer 13 with a distance smaller than 100 nm from the light incident surface thereof is configured to generate a corresponding electrical signal according to a received optical signal, and the remaining portion serves as a dielectric layer to perform the functions of insulating and reducing the dark current.

It could be understood that the above embodiments are merely exemplary embodiments employed to illustrate the principle of the present disclosure, and the present disclosure is not limited thereto. It will be apparent to those skilled in the art that various changes and modifications can be made without departing from the spirit and scope of the present disclosure, and these changes and modifications are also considered to be within the protection scope of the present disclosure.

What is claimed is:

1. A flat panel detection substrate, comprising:
   a base substrate;
   a bias electrode and a sense electrode on the base substrate; and
   a semiconductor layer at a side of the bias electrode and the sense electrode away from the base substrate, the semiconductor layer having a thickness greater than 100 nm,
   wherein the semiconductor layer comprises a first semiconductor layer and a second semiconductor layer, the second semiconductor layer is on a side of the first semiconductor layer away from the bias electrode and the second electrode; and a mobility of the second semiconductor layer is higher than a mobility of the first semiconductor layer, and
   wherein the mobility of the first semiconductor layer is less than 0.5 cm/vs, and the mobility of the second semiconductor layer is greater than 0.75 cm/vs.

2. The flat panel detection substrate of claim 1, wherein a material of the semiconductor layer comprises a-Si.

3. The flat panel detection substrate of claim 1, wherein an insulating element is disposed between the bias electrode and the sense electrode, the semiconductor layer covers the bias electrode, the sense electrode, and the insulating element; and a material of the insulating element comprises an inorganic insulating material.

4. The flat panel detection substrate of claim 3, wherein a thickness of the insulating element is between 100 nm and 300 nm.

5. The flat panel detection substrate of claim 1, wherein a dielectric layer is further disposed between the bias electrode and the semiconductor layer and between the sense electrode and the semiconductor layer, and a material of the dielectric layer comprises a metal oxide.

6. The flat panel detection substrate of claim 5, wherein a material of the bias electrode and the sense electrode comprises a metal; and
   the material of the dielectric layer comprises an oxide of the metal.

7. The flat panel detection substrate of claim 1, wherein the bias electrode and the sense electrode are in an interdigital comb structure.

8. The flat panel detection substrate of claim 1, further comprising: a thin film transistor, wherein a drain electrode of the thin film transistor is electrically coupled to the sense electrode.

9. The flat panel detection substrate of claim 1, further comprising:
   an interlayer insulating layer on the substrate; and a first through hole and a second through hole penetrating the interlayer insulating layer, wherein the first through hole and the second through hole are not aligned in a vertical direction.

10. The flat panel detection substrate of claim 9, further comprising a connection electrode at least partially covering inner walls of the first and second through holes.

11. The flat panel detection substrate of claim 10, further comprising a thin film transistor, wherein a drain electrode of the thin film transistor is coupled to the sense electrode through the connection electrode.

12. A method for fabricating a flat panel detection substrate, comprising:
preparing a base substrate; and
forming a bias electrode and a sense electrode over the base substrate and a semiconductor layer covering the bias electrode and the sense electrode; wherein a thickness of the semiconductor layer is greater than 100 nm, wherein the semiconductor layer comprises a first semiconductor layer and a second semiconductor layer, the second semiconductor layer is on a side of the first semiconductor layer away from the bias electrode and the second electrode; and a mobility of the second semiconductor layer is higher than a mobility of the first semiconductor layer, and
wherein the mobility of the first semiconductor layer is less than 0.5 cm/vs, and the mobility of the second semiconductor layer is greater than 0.75 cm/vs.

13. The method for fabricating the flat panel detection substrate of claim 12, wherein forming the semiconductor layer comprises:
depositing the first semiconductor layer at a first deposition rate;
depositing the second semiconductor layer at a second deposition rate; the first deposition rate being greater than the second deposition rate.

14. The method for fabricating the flat panel detection substrate of claim 12, prior to forming the semiconductor layer, the method further comprising:
forming an insulating element between the bias electrode and the sense electrode; wherein a material of the insulating element comprises: an inorganic insulating material.

15. The method for fabricating the flat panel detection substrate of claim 12, wherein a material of the bias electrode and the sense electrode comprises a metal, a dielectric layer is between the bias electrode and the semiconductor layer and between the sense electrode and the semiconductor layer, a material of the dielectric layer comprises a metal oxide, and forming the bias and sense electrodes and the dielectric layer comprises:
forming a metal material layer; and
performing oxidation treatment on a surface of the metal material layer, and forming a pattern comprising the bias electrode, the sense electrode and the dielectric layer by a patterning process.

16. A flat panel detector, comprising the flat panel detection substrate of claim 1.

17. The flat panel detection substrate of claim 1, wherein the semiconductor layer is in direct contact with the bias electrode and the sense electrode.

* * * * *